United States Patent
Mihopoulos et al.

(10) Patent No.: US 6,528,377 B1
(45) Date of Patent: Mar. 4, 2003

(54) SEMICONDUCTOR SUBSTRATE AND METHOD FOR PREPARING THE SAME

(75) Inventors: Theodoros Mihopoulos, Austin, TX (US); Prasad V. Alluri, Austin, TX (US); J. Vernon Cole, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/501,950

(22) Filed: Feb. 10, 2000

(51) Int. Cl.$^7$ .......................................... H01L 21/331
(52) U.S. Cl. ..................... 438/311; 438/151; 438/154; 438/312; 438/322
(58) Field of Search .................................. 438/149, 150, 438/151, 311, 341, 152, 153, 154, 312, 313, 322, 347

(56) References Cited

U.S. PATENT DOCUMENTS

| | | | |
|---|---|---|---|
| 4,882,300 A | | 11/1989 | Inoue et al. ............... 437/236 |
| 5,185,689 A | * | 2/1993 | Maniar ...................... 361/313 |
| 5,434,742 A | * | 7/1995 | Saito et al. ............... 361/321.5 |
| 5,519,566 A | * | 5/1996 | Perino et al. ............. 361/321.4 |
| 5,589,284 A | * | 12/1996 | Summerfelt et al. ........ 428/697 |
| 5,674,366 A | | 10/1997 | Hayashi et al. ........ 204/298.09 |
| 5,731,220 A | | 3/1998 | Tsu et al. .................... 437/60 |
| 5,801,105 A | | 9/1998 | Yano et al. ................. 438/785 |
| 5,828,080 A | | 10/1998 | Yano et al. .................. 257/43 |
| 5,876,503 A | * | 3/1999 | Roeder et al. .............. 118/715 |
| 5,990,507 A | * | 11/1999 | Mochizuki et al. ......... 257/295 |
| 6,013,553 A | | 1/2000 | Wallace et al. ............. 438/287 |
| 6,020,243 A | | 2/2000 | Wallace et al. ............. 438/287 |
| 6,054,363 A | * | 4/2000 | Sakaguchi et al. .......... 438/406 |
| 6,242,298 B1 | * | 6/2001 | Kawakubo .................. 438/239 |

FOREIGN PATENT DOCUMENTS

| | | | | |
|---|---|---|---|---|
| FR | WO-96/11887 | * | 4/1996 | ........... C03C/3/091 |
| JP | 63-198365 | | 8/1988 | ........... H01L/27/04 |

OTHER PUBLICATIONS

Sakaguchi et al., "ELTRAN by Splitting Porous Si Layers," ELTRAN Project, Canon, Inc. (2 pgs.).

Yonehara, "ELTRAN; Epitaxial Layer Transfer," SEMI Si Wafer Symposium, pp. 1–6 (1998).

Kang et al., "Epitaxial Growth of $CeO_2(100)$ Films on Si(100) Substrates by Dual Ion Beams Reactive Sputtering," Elsevier Science Ltd., pp. 225–227 (1998).

Haisma et. al., "Silicon–Wafer Fabrication and (Potential) Applications of Direct–Bonded Silicon," Philips Journal of Research, pp. 65–89 (1995).

Chikyow et al., "Reaction and regrowth control of $CeO_2$ on Si(111) surface for the silicon–on–insulator structure," American Institute of Physics, pp. 1030–1032 (1994).

Maszara, "Silicon–On–Insulator by Wafer Bonding: A Review," Journal of the Electrochemical Society, pp. 341–347 (1991).

Abe et al., Wafer Bonding Technique for Silicon–on–Insulator Technology, Solid State Technology, pp. 39–40 (1990).

Asano et al., "An Epitaxial Si/Insulator/Si Structure Prepared by Vacuum Deposition of $CaF_2$ and Silicon," Tokyo Institute of Technology, pp. 143–150 (1982).

* cited by examiner

Primary Examiner—Matthew Smith
Assistant Examiner—Renzo N. Rocchegiani
(74) Attorney, Agent, or Firm—Robert A. Rodriguez; Joseph P. Lally

(57) ABSTRACT

A silicon-on-insulator substrate and its method of formation are disclosed. In another embodiment, a method for forming a high-k gate dielectric is disclosed. The silicon-on-insulator substrate is prepared by forming a lattice matched dielectric layer (20) over a semiconductor substrate (10). A thermodynamically stable dielectric layer (22) is then formed over the lattice matched dielectric layer (20). A semiconductor layer (30) is then formed over the thermodynamically stable dielectric layer (22). Formation of the high-k gate dielectric includes the processing steps used to form the silicon-on-insulator substrate and additionally includes bonding a second semiconductor substrate (50) to the semiconductor layer (30). The first semiconductor substrate (10) is then removed to expose the lattice matched dielectric layer (20). This results in a silicon substrate that has a layer of high-k dielectric material that can be used as the gate dielectric for integrated circuits formed on the substrate.

18 Claims, 2 Drawing Sheets

SEMICONDUCTOR SUBSTRATE AND METHOD FOR PREPARING THE SAME

RELATED APPLICATIONS

This application is related to Ser. No. 6,392,257 filed May 21, 2002, entitled "Semiconductor Structure, Semiconductor Device, Communicating Device, Integrated Circuit, and Process for Fabricating the Same," filed of even date and assigned to the Assignee hereof.

FIELD OF THE INVENTION

The invention relates generally to integrated circuit manufacturing and more particularly to a method for processing semiconductor substrates and an apparatus thereof.

BACKGROUND OF THE INVENTION

Integrated circuits are being used in an increasing number of applications that benefit from reduced power consumption. For example, hand-held devices, cellular phones, and other battery operated devices benefit from reduced power consumption characteristics that allow for smaller batteries or longer periods of functionality based on a limited power supply. The need for integrated circuits that exhibit reduced power consumption characteristics has therefore led to the development of semiconductor manufacturing technologies that provide for lower power consumption in integrated circuits.

One technique used to reduce power consumption includes manufacturing the integrated circuits on silicon-on-insulator substrates. Silicon-on-insulator (SOI) structures are known to exhibit favorable power consumption characteristics in comparison with conventional CMOS structures. In addition, SOI structures can produce improved speed characteristics over CMOS technologies as transistor threshold voltages are reduced.

One prior art technique for creating SOI structures includes implanting oxygen into a silicon wafer to form a buried oxide layer. The overlying silicon layer is then annealed in an attempt to restore the crystalline structure of the silicon layer such that it is suitable for device fabrication. However, oxygen implantation often compromises the overlying silicon crystalline structure to a degree that inhibits proper semiconductor device formation due to high defect densities included in the overlying silicon layer. This condition typically persists even after annealing.

In another prior art technique used to generate SOI structures, direct wafer bonding and subsequent separation are used to create the underlying insulating layer. In such prior art techniques, the insulating layer is grown or deposited on a first silicon wafer that is then bonded to a second silicon wafer. A portion of the first silicon wafer is then removed through etching, cleaving, or some other form of physical separation such that a layer of silicon (which had been in an underlying position with respect to the insulating layer on the first wafer) is left to remain overlying the insulating layer on the second wafer. As such, the resulting structure provides pure silicon overlying an insulating layer that is suitable for SOI applications. This prior art technique suffers from a lack of control and results in increased thickness variation of the silicon layer that is formed overlying the insulating layer. For a device manufactured using fully depleted SOI, an important SOI substrate parameter is the thickness of the silicon layer, because thickness variations can directly affect the device threshold voltage. In addition, this prior art technique is costly to implement in a manufacturing environment.

Another issue in semiconductor device fabrication includes the scaling of gate dielectric layers. In some integrated circuit processes, thinner gate dielectric layers are required to achieve desired transistor characteristics based on the dielectric constant of the gate dielectric material used in the process. Thinner gate dielectric layers can lead to problems such as boron penetration, tunneling, etc. Such effects make the reduction of the thickness of silicon dioxide gate dielectric layers below approximately 20 angstroms problematic.

One prior art solution to the problem with gate dielectric scaling includes using high dielectric constant (high-k) dielectric materials to form the gate dielectric. For the purposes of this specification, a high-k material is any dielectric material having a dielectric constant greater than approximately 4.5. By utilizing high-k materials for gate dielectrics in integrated circuit structures, thicker gate dielectric layers can be utilized while maintaining desirable transistor characteristics and avoiding the detrimental effects associated with tunneling, boron penetration, and the like. Although higher k dielectrics are desirable, their formation can be problematic as the interface between the high-k dielectric and silicon often results in a thin layer of silicon oxide being inadvertently formed at the junction. Because silicon oxide has a low dielectric constant, the combination of the low dielectric constant of the silicon oxide with the higher dielectric constant of the high-k dielectric results in undesirably lower overall dielectric constant for the resulting gate dielectric material.

BRIEF DESCRIPTION OF THE DRAWINGS

The present invention is illustrated by way of example and not limitation in the accompanying figures, in which like references indicate similar elements, and in which.

Figure 1:
FIG. 1 illustrates a cross-sectional view of a seed layer overlying a semiconductor substrate in accordance with the particular embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

In one embodiment, the present invention provides a silicon-on-insulator substrate and a method for forming such a substrate. In another embodiment, the invention provides a high-k dielectric that may be used as the gate dielectric in an integrated circuit formed on a semiconductor substrate and a method for forming such a substrate that includes the high-k dielectric. The silicon-on-insulator substrate is prepared by forming a lattice matched dielectric layer over the semiconductor substrate. A thermodynamically stable dielectric layer is then formed over the lattice matched dielectric layer. A semiconductor layer is then formed over the thermodynamically stable dielectric layer to complete the silicon-on-insulator substrate which may then be used to form integrated circuits with preferable electrical characteristics to those implemented using bulk silicon substrates. In order to form high-k dielectric layers for use as gate dielectrics in integrated circuits, the steps used to form the silicon-on-insulator substrate are repeated. Following formation of the semiconductor layer over the thermodynamically stable dielectric layer, a second semiconductor substrate is bonded to the semiconductor layer. The aforementioned semiconductor layer is typically formed in a non-oxygen containing ambient atmosphere in order to avoid the formation of interfacial oxide between the underlying dielectric layer and the semiconductor layer. The first semiconductor substrate upon which the lattice matched dielectric layer was first deposited is then removed to expose the lattice matched dielectric layer. This results in a silicon substrate that has a layer of high-k dielectric material that can be used as the gate dielectric in integrated circuit devices formed on the substrate.

The invention can be better understood with reference to FIGS. 1–7. FIGS. 1–4 illustrate cross-sectional views of a semiconducting substrate upon which various layers are deposited to promote formation of semiconductor devices that may be included in integrated circuits formed on the substrate. The various layers included in FIGS. 1–3 form a silicon-on-insulator substrate such that high speed/low power devices can be implemented in a cost effective and manufacturable manner.

In order to prepare a semiconductor substrate for use as a silicon-on-insulator substrate, the top layer of silicon deposited over the insulator is preferably formed in a manner that is well controlled. Desirable characteristics for this silicon layer include a high crystalline quality of silicon as well as a high level of control of the thickness of the silicon layer. Control over the thickness of this silicon layer is important because a relatively thin layer of silicon is desirable in silicon-on-insulator substrate devices.

Preparing a substrate for use as a silicon-on-insulator substrate begins by forming a lattice matched dielectric layer over a semiconductor substrate. In order to allow proper formation of the lattice matched dielectric layer over the semiconductor substrate, a seed layer may first be formed over the substrate in order to promote alignment of the lattice structures of the substrate and the overlying dielectric layer. FIG. 1 illustrates a cross-sectional view of a substrate 10 upon which a where a seed layer 12 has been formed. The substrate 10 may be a semiconducting substrate that includes silicon or germanium. In one embodiment, the substrate is a silicon wafer.

The seed layer 12 that is formed over the substrate 10 can include elements such as strontium, hafnium, barium, lanthanum, and zirconium. In one embodiment, the seed layer 12 includes strontium. In the embodiment where strontium is used as a seed layer 12 and the underlying substrate is monocrystalline silicon, the lattice of the strontium layer should be rotated by approximately 45 degrees during the deposition such that it aligns with the lattice of the underlying substrate. The seed layer 12 will then assist in promoting the epitaxial deposition of the subsequently deposited dielectric material, thereby forming single crystalline dielectric layer.

The seed layer 12 may be formed over the substrate using molecular beam epitaxy (MBE) deposition techniques such that one or more monolayers of seed layer material are deposited over the substrate layer 10. The seed layer formation may also include an annealing step that further promotes the ability for subsequent material to be deposited in an efficient manner.

Figure 2:
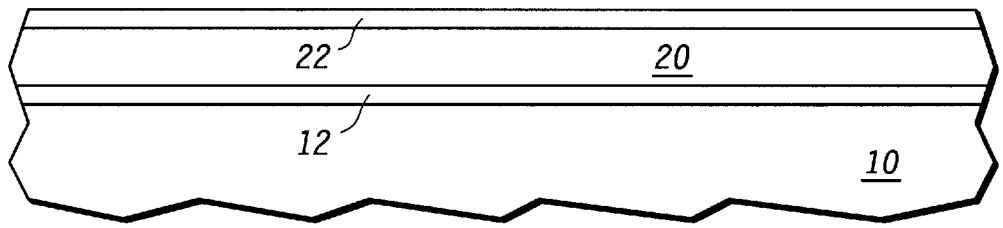
FIG. 2 illustrates a cross-sectional view of the semiconductor substrate of FIG. 1 to which an overlying high-k dielectric layer and a thermodynamically stable layer has been added in accordance with a particular embodiment of the present invention.

Following formation of the seed layer 12 over the substrate 10, a lattice matched dielectric layer 20 is formed over the seed layer. This is illustrated in FIG. 2. Because the seed layer 12 has been formed over the substrate 10, the lattice matched dielectric layer 20 may be formed using chemical vapor deposition, which is a processing step well known in the art that is often employed in semiconductor wafer manufacturing operations. The lattice matched dielectric layer 20 is a material that has a lattice structure that has a lattice constant that closely approximates that of the underlying semiconducting substrate 10. The lattice constant of silicon is approximately 5.43 angstroms. Materials that may be considered to be lattice matched to silicon would include those materials having a lattice constant, or inter planar distance, that is within a range plus or minus 10% of the lattice constant of silicon. More typically, the lattice constant of a lattice matched dielectric material will be in a 5% range of the lattice constant of silicon. Some dielectric materials that are suitable for use as the lattice matched dielectric layer 20 include strontium titanate ($SrTiO_3$), barium titanate ($BaTiO_3$), and barium strontium titanate ($Ba_xSr_{1-x}TiO_3$). In other embodiments, the lattice matched dielectric layer 20 may be a material formed from elements including barium, strontium, titanium, oxygen, cerium, aluminum, and lanthanum. One example of such a material is lanthanum aluminate ($LaAlO_3$).

The lattice matched dielectric layer 20 that is formed over the seed layer 12 should be formed to a thickness such that there is proper isolation of the semiconducting devices that will eventually be formed on an overlying semiconducting layer. As such, the thickness of the lattice matched dielectric layer should be on the order of 5000 angstroms to provide a reasonable level of isolation. As is apparent to one of ordinary skill in the art, thicker layers of lattice matched dielectric material may be employed to provide such isolation.

Following formation of the lattice matched dielectric layer 20, a thermodynamically stable dielectric layer 22 may be formed over the lattice matched dielectric layer. The thermodynamically stable dielectric layer 22 reduces the likelihood that a subsequently formed semiconducting layer interacts with the lattice matched dielectric layer 20 in a manner that would degrade the performance of subsequently formed integrated circuits. Such degradation may be caused by migration of oxygen or similar materials into the semiconducting layer during device manufacturing steps, which typically include high temperature operations.

The thermodynamically stable dielectric layer 22 may be formed of strontium oxide (SrO), barium oxide (BaO), or lanthanum oxide ($La_2O_3$). Strontium oxide is known to provide favorable thermodynamic characteristics under heat stress such that the oxygen included in the strontium oxide does not migrate into surrounding materials. As such, the thermodynamically stable dielectric layer 22 provides an effective barrier between the lattice matched dielectric layer 20 and the subsequently formed overlying semiconducting layer within which the device structures are formed. The thermodynamically stable dielectric layer 22 is typically formed to a thickness of less than 10 angstroms (approximately 3 monolayers). Thicker thermodynamically stable dielectric layers may be undesirable due to the instability of the thermodynamically stable dielectric material in some environments such as those that include water vapor.

Figure 3:
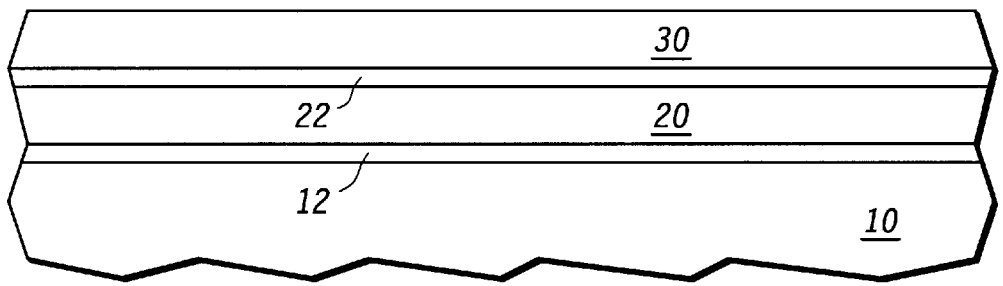
FIG. 3 illustrates a cross-sectional view of a silicon-on-insulator substrate as formed in accordance with a particular embodiment of the present invention.

After formation of the thermodynamically stable dielectric layer 22, a semiconductor layer 30, as illustrated in FIG. 3, is formed over the thermodynamically stable dielectric layer 22. The semiconductor layer may include semiconducting materials such as silicon and germanium that are epitaxially deposited. In one embodiment, the semiconductor layer 30 is silicon. The semiconductor layer 30 that is formed over the thermodynamically stable dielectric layer 22 may be doped to form either an N-type or P-type semiconductor material. This doping can be performed concurrent with the formation of the semiconductor layer by forming the semiconductor layer in the presence of a dopant gas such as arsine, phosphene, diborane, etc.

Because the semiconductor layer 30 is the layer within which the semiconducting devices are formed during IC manufacturing, the purity and depth of the silicon layer should be taken into consideration. In one embodiment, the thickness of the semiconductor layer 30 is approximately 30 nanometers, but as is apparent to one of ordinary skill in the art, the thickness of the semiconductor layer 30 may be adapted to suit different process methodologies.

Some SOI substrate technologies utilize fully depleted silicon-on-insulator material, and in such embodiments the thickness of the semiconductor layer 30 is approximately 30 nanometers. In other SOI methodologies, partially depleted semiconductor-on-insulator technology is employed, and in such embodiments the thickness of the semiconductor layer 30 is less critical and typically thicker than that which may be present in a fully depleted SOI methodology.

Once the SOI substrate is formed as illustrated in FIG. 3, devices can be formed in the semiconductor layer 30 such that integrated circuits having beneficial characteristics can be produced. Processing technology associated with formation of such devices is well known in the art.

Figure 4:
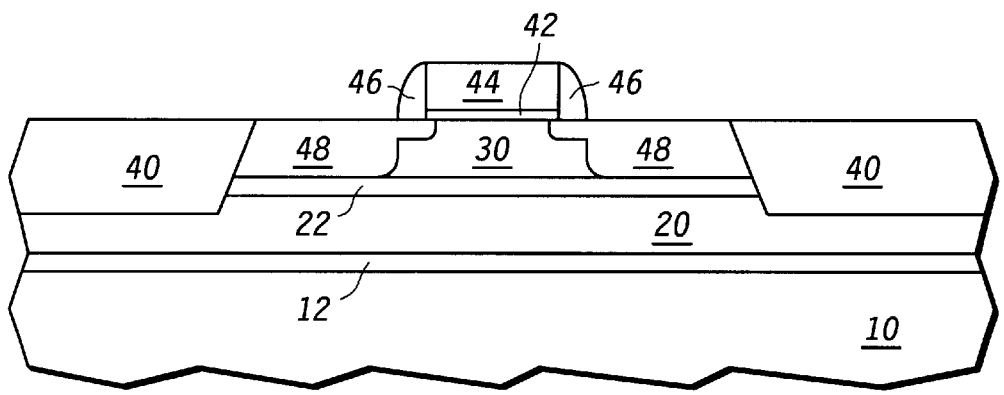
FIG. 4 illustrates a cross-sectional view of a semiconductor device formed on the silicon-on-insulator substrate of FIG. 3 in accordance with a particular embodiment of the present invention.

FIG. 4 illustrates a semiconductor device formed using the SOI substrate illustrated in FIG. 3. The semiconductor device illustrated in FIG. 4 is shown to include shallow trench isolation regions 40, source and drain regions 48, gate dielectric region 42, gate electrode 44, and spacers 46. The functionality of these components is well known with respect to CMOS device operation, and the processing steps required for their formation is also well known and therefore is not discussed in detail herein.

Figure 5:
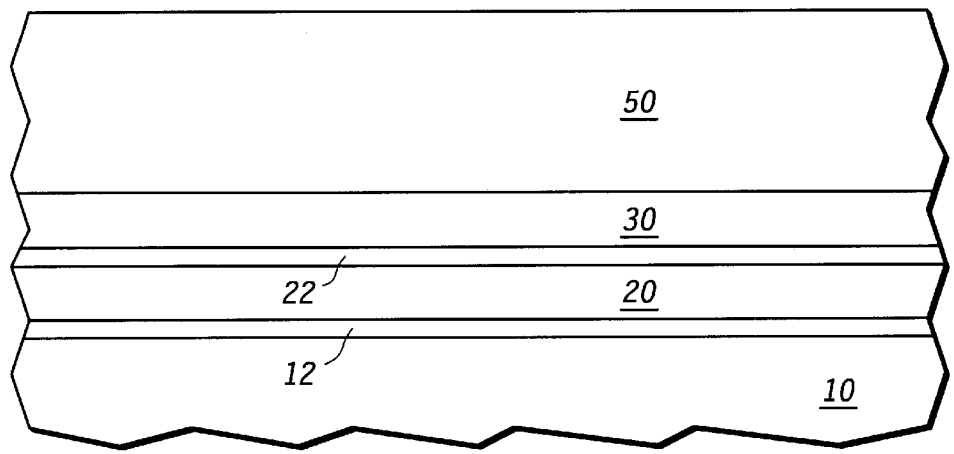
FIG. 5 illustrates a cross-sectional. view of a wafer-bonded structure that includes a silicon wafer bonded to the top most silicon layer of the structure illustrated in FIG. 3.

Similar processing steps used to create the SOI substrate as illustrated in FIGS. 1–3 can be employed to perform the first portion of a set of processing steps used to create a high-k dielectric layer that can be used as a gate dielectric in a transistor structure. FIG. 5 illustrates a cross-sectional view of the structure illustrated in FIG. 3 after an additional semiconductor substrate 50 has been bonded to the semiconductor layer 30. The semiconductor substrate 50 may be an silicon wafer that is bonded to the substrate of FIG. 3, using conventional wafer bonding techniques as known to one of ordinary skill in the art.

Following the bonding of a second semiconductor substrate 50 to the semiconductor layer 30, the original semiconductor substrate 10 upon which the lattice matched dielectric layer 20 was formed is removed. Removal of the first semiconductor substrate 10 may be accomplished using conventional processes know to one or ordinary skill in the art, such as etching or cleaving. If cleaving is used to remove the semiconductor substrate 10, an additional hydrogen implantation processing step may be included when the substrate 10 is originally formed such that a porous silicon layer that promotes controlled and efficient separation of the semiconductor substrate 10 during the cleaving process is included in the semiconductor substrate 10.

The removal of the semiconductor substrate 10 exposes the lattice matched dielectric layer 20. The cross-sectional view illustrated in FIG. 6 has been inverted to promote understanding of the subsequent processing steps with respect to the resulting substrate structure. Because the lattice matched dielectric layer 20 is to be used as the gate dielectric of semiconductor devices, the thickness of the lattice matched dielectric layer 20 should be controlled to provide the correct electrical characteristics required for the gate dielectric. The thickness of the lattice matched dielectric layer 20 may be on the order of 30–100 angstroms such that functional transistors can be formed which utilize the lattice matched dielectric layer 30 as gate dielectric material. As is apparent to one of ordinary skill in the art, in different embodiments the thickness of the lattice matched dielectric layer 30 will vary based on the material used to form the lattice matched dielectric layer 30 as well as the electrical characteristic requirements of the devices that utilize the lattice matched dielectric layer 30 as a gate dielectric.

Figure 6:
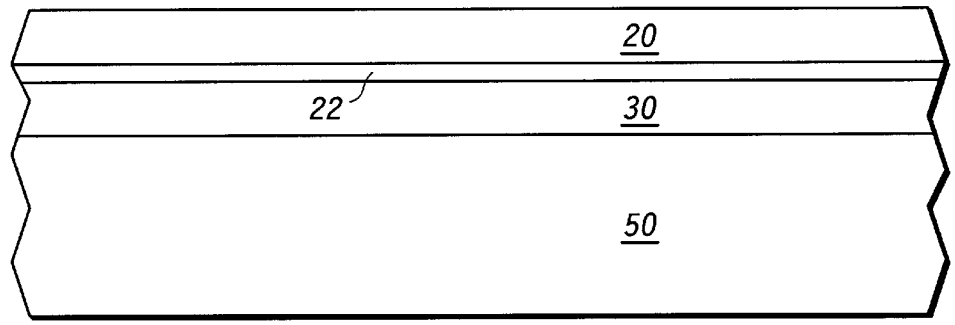
FIG. 6 illustrates a cross-sectional view of a substrate that includes a high-k dielectric layer for use in construction of integrated circuits in accordance with a particular embodiment of the present invention.
Figure 7:
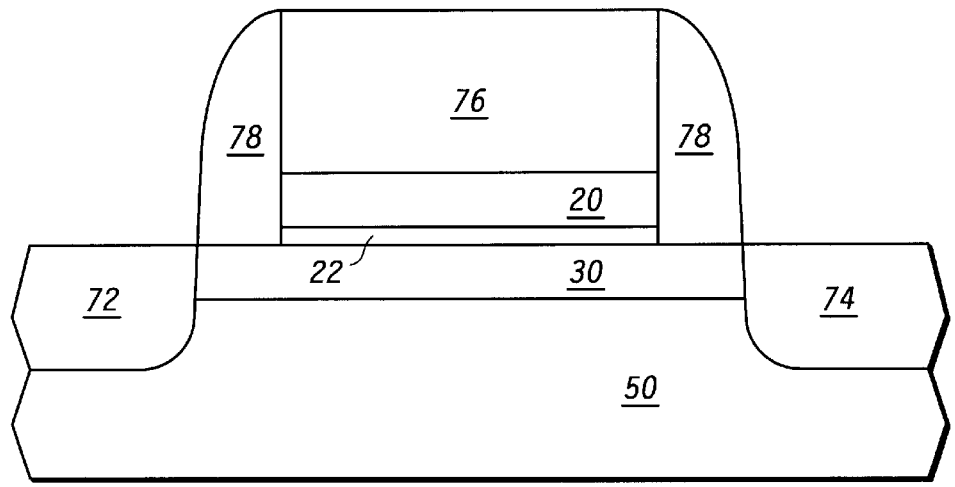
FIG. 7 illustrates a cross-sectional view of a device formed on the substrate that includes the high-k dielectric illustrated in FIG. 6.

Once the first semiconductor substrate 10 has been removed, the resulting substrate, which is illustrated in FIG. 6, is suitable for use in forming semiconducting devices. FIG. 7 illustrates an example semiconducting device formed on the substrate of FIG. 6. The semiconducting device in FIG. 7 is shown to include source and drain regions 72 and 74, gate electrode 76, and spacers 78. Note that the gate dielectric portion of the device illustrated in FIG. 7 includes both the lattice matched dielectric layer 20 and the thermodynamically stable dielectric layer 22. Because the thermodynamically stable dielectric layer 22, which is a high-K material, prevents an interfacial oxide layer (low-K material) from forming between the lattice matched dielectric layer 20 and the semiconductor layer 30, the dielectric constant of the gate dielectric will not be compromised, thus maintaining the high-k gate dielectric needed for proper device operation.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for preparing a substrate comprising:
   forming a lattice matched dielectric layer over a first semiconductor substrate;
   forming a thermodynamically stable dielectric layer over the lattice matched dielectric layer; and
   forming a semiconductor layer over the thermodynamically stable dielectric layer.

2. The method of claim 1 further comprising:
   bonding a second semiconductor substrate to the semiconductor layer; and
   removing the first semiconductor substrate to expose the lattice matched dielectric layer; and
   forming a portion of a semiconductor device over the lattice matched dielectric layer.

3. The method of claim 2, wherein the lattice matched dielectric layer is further characterized as a gate dielectric layer for the semiconductor device.

4. The method of claim 1, wherein the lattice matched dielectric layer includes an element selected from a group consisting of strontium, titanium, barium, lanthanum, aluminum, and oxygen.

5. The method of claim 1, wherein the first semiconductor substrate includes a semiconductor material selected from a group consisting of silicon and germanium.

6. The method of claim 1, wherein the thermodynamically stable dielectric layer includes materials selected from a group consisting of strontium oxide, barium oxide, and lanthanum oxide.

7. A method for preparing a silicon substrate comprising:
   forming a seed layer on the substrate;
   chemical vapor depositing a lattice matched dielectric layer on the seed layer
   forming a thermodynamically stable dielectric layer over the lattice matched dielectric layer; and
   forming a semiconductor layer over the thermodynamically stable dielectric layer.

8. The method of claim 7, wherein the substrate is further characterized as a silicon substrate.

9. The method of claim 7, wherein lattice matched dielectric layer comprises an alkaline earth metal selected from strontium and barium and wherein the seed layer comprises the selected alkaline earth metal.

10. The method of claim 7, wherein the lattice matched dielectric layer includes strontium titanate.

11. The method of claim 7, wherein the lattice matched dielectric layer includes barium titanate.

12. The method of claim 7, wherein the lattice matched dielectric layer includes barium strontium titanate.

13. A method for preparing a substrate comprising:
    forming a lattice matched dielectric layer over a first semiconductor substrate;
    forming a thermodynamically stable dielectric layer over the lattice matched dielectric layer;
    forming a semiconductor layer over the thermodynamically stable dielectric layer;
    bonding a second semiconductor substrate to the semiconductor layer;
    removing the first semiconductor substrate to expose the lattice matched dielectric layer; and
    forming a semiconductor device over the lattice matched dielectric layer.

14. The method of claim 13, wherein the lattice matched dielectric layer is further characterized as a portion of a gate dielectric layer for the semiconductor device.

15. The method of claim 14, wherein the lattice matched dielectric layer includes materials selected from the group consisting of barium, strontium, titanium, oxygen, cerium, aluminum, and lanthanum.

16. The method of claim 13, wherein the thermodynamically stable dielectric layer includes materials selected from the group consisting of barium oxide, strontium oxide and lanthanum oxide.

17. The method of claim 13, wherein the first semiconductor substrate includes a semiconductor material selected from a group consisting of silicon and germanium.

18. The method of claim 13, wherein the second semiconductor substrate includes a semiconductor material selected from a group consisting of silicon and germanium.

* * * * *